(12) United States Patent
Berthelon et al.

(10) Patent No.: US 10,263,110 B2
(45) Date of Patent: Apr. 16, 2019

(54) METHOD OF FORMING STRAINED MOS TRANSISTORS

(71) Applicants: STMicroelectronics (Crolles 2) SAS, Crolles (FR); STMicroelectronics SA, Montrouge (FR); Commissariat A L'Energie Atomique et aux Energies Alternatives, Paris (FR)

(72) Inventors: Remy Berthelon, Saint Martin Heres (FR); Didier Dutartre, Meylan (FR); Pierre Morin, Albany, NY (US); Francois Andrieu, Saint-Ismier (FR); Elise Baylac, Les Adrets (FR)

(73) Assignees: STMicroelectronics (Crolles 2) SAS, Crolles (FR); STMicroelectronics SA, Montrouge (FR); Commissariat A L'Energie Atomique et aux Energies Alternatives, Paris (FR)

( * ) Notice: Subject to any disclaimer, the term of this patent is extended or adjusted under 35 U.S.C. 154(b) by 11 days.

(21) Appl. No.: 15/387,712

(22) Filed: Dec. 22, 2016

(65) Prior Publication Data
US 2017/0194498 A1 Jul. 6, 2017

(30) Foreign Application Priority Data
Dec. 31, 2015 (FR) ...................... 15 63507

(51) Int. Cl.
*H01L 29/207* (2006.01)
*H01L 27/12* (2006.01)
(Continued)

(52) U.S. Cl.
CPC .... *H01L 29/7849* (2013.01); *H01L 21/02236* (2013.01); *H01L 21/02238* (2013.01);
(Continued)

(58) Field of Classification Search
CPC ......... H01L 21/823878; H01L 27/1203; H01L 21/823807; H01L 21/823814;
(Continued)

(56) References Cited

U.S. PATENT DOCUMENTS

| 6,194,256 B1 | 2/2001 | Lee et al. |
| 2006/0172495 A1* | 8/2006 | Zhu .......................... H01L 21/84 438/275 |

(Continued)

OTHER PUBLICATIONS

Thean A V-Y et al: "Uniaxial-biaxial stress hybridization for super-critical strained-si directly on insulator (SC-SSOI) PMOS with different channel orientations," International Electron Devices Meeting, IEEE, Dec. 5, 2005, pp. 509-512, XP010903524.

(Continued)

*Primary Examiner* — Brian Turner
(74) *Attorney, Agent, or Firm* — Crowe & Dunlevy

(57) ABSTRACT

A strained semiconductor layer is produced from a semiconductor layer extending on an insulating layer. A thermal oxidization is performed on the semiconductor layer across its entire thickness to form two bars extending in a direction of a transistor width. Insulating trenches are formed in a direction of a transistor length. A strain of the strained semiconductor layer is induced in one implementation before the thermal oxidation is performed. Alternatively, the strain is induced after the thermal oxidation is performed. The insulating trenches serve to release a component of the strain extending in the direction of transistor width. A component of the strain extending in the direction of transistor length is maintained. The bars and trenches delimit an active area of the transistor include source, drain and channel regions.

10 Claims, 5 Drawing Sheets

(51) Int. Cl.
*H01L 21/84* (2006.01)
*H01L 21/8238* (2006.01)
*H01L 21/336* (2006.01)
*H01L 29/78* (2006.01)
*H01L 21/02* (2006.01)
*H01L 21/762* (2006.01)
*H01L 29/66* (2006.01)

(52) U.S. Cl.
CPC .. *H01L 21/02532* (2013.01); *H01L 21/76283* (2013.01); *H01L 29/66477* (2013.01); *H01L 29/66568* (2013.01); *H01L 29/66772* (2013.01); *H01L 29/7846* (2013.01); *H01L 21/02255* (2013.01)

(58) Field of Classification Search
CPC ......... H01L 21/823864; H01L 29/7843; H01L 29/7846; H01L 29/7848; H01L 29/7849
See application file for complete search history.

(56) References Cited

U.S. PATENT DOCUMENTS

| | | | |
|---|---|---|---|
| 2007/0262392 A1* | 11/2007 | Sudo | H01L 21/823807 257/371 |
| 2008/0251842 A1 | 10/2008 | Sudo | |
| 2009/0305474 A1* | 12/2009 | Bryant | H01L 21/823807 438/199 |
| 2014/0011328 A1* | 1/2014 | Bedell | H01L 21/84 438/154 |
| 2015/0001623 A1* | 1/2015 | Wang | H01L 29/78654 257/347 |
| 2015/0097241 A1 | 4/2015 | Rideau et al. | |

OTHER PUBLICATIONS

Grenouillet, L, et al: "UTBB FDSOI transistors with dual STI for a multi-Vt strategy at 20nm node and below," 2012 (3 pages).

* cited by examiner

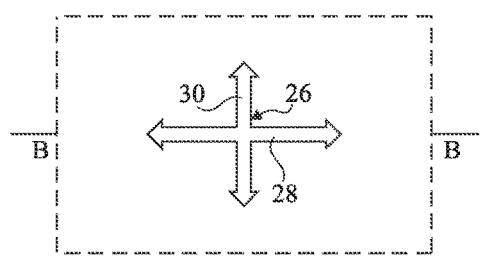
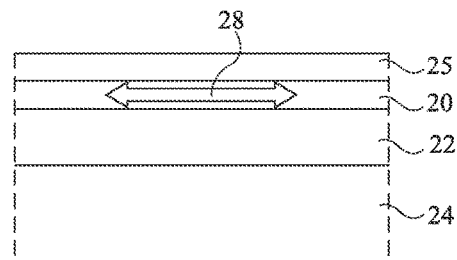
Fig 3A Fig 3B
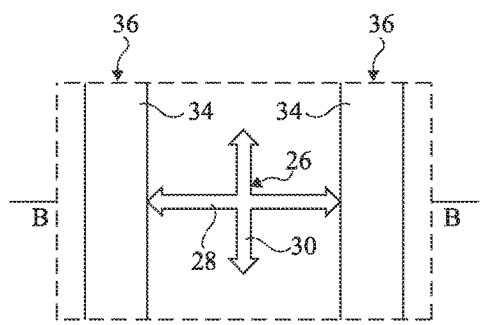
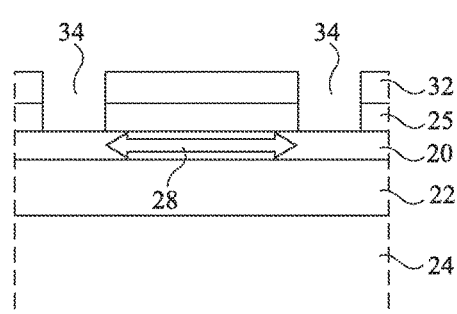
Fig 4A Fig 4B
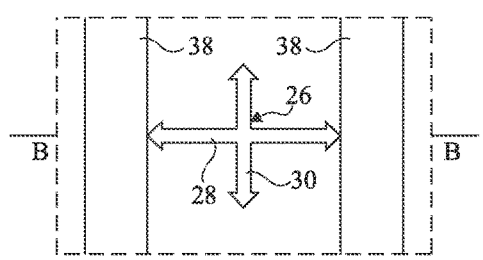
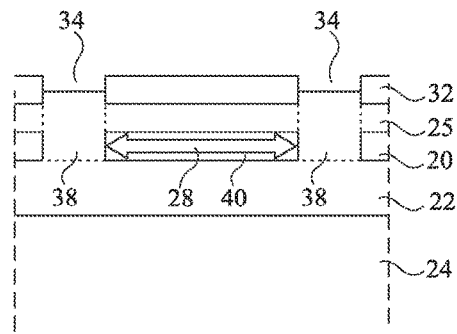
Fig 5A Fig 5B
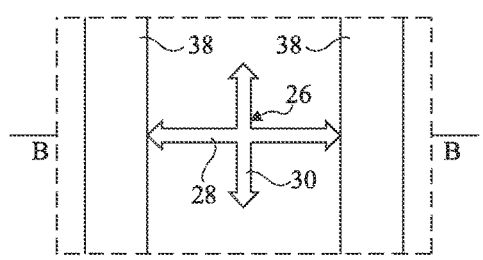
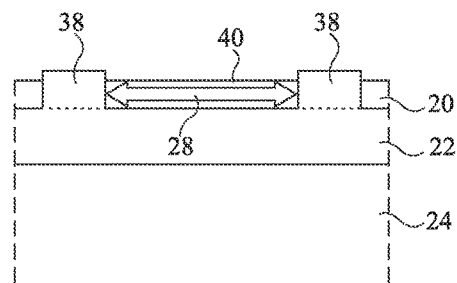
Fig 6A Fig 6B

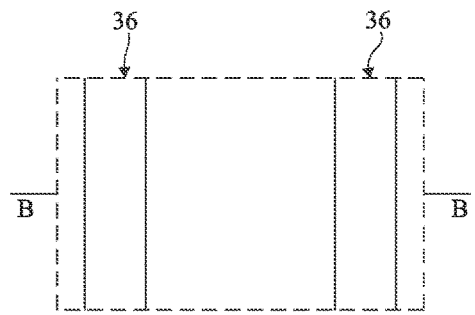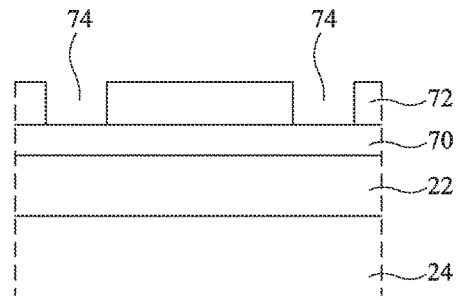
Fig 9A    Fig 9B
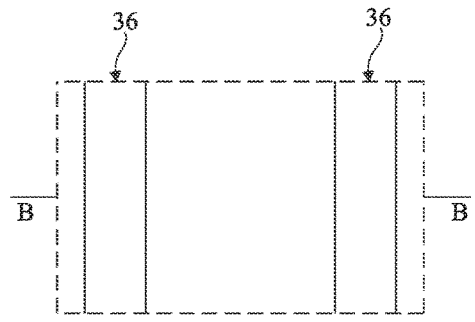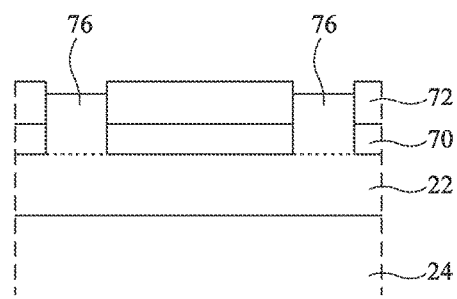
Fig 10A    Fig 10B
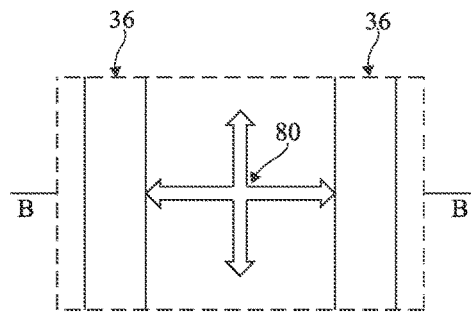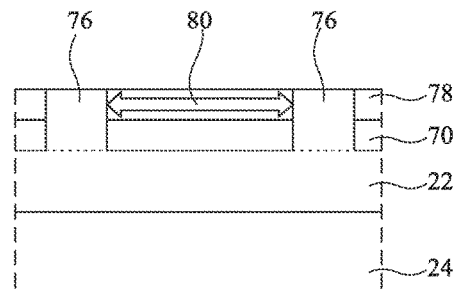
Fig 11A    Fig 11B
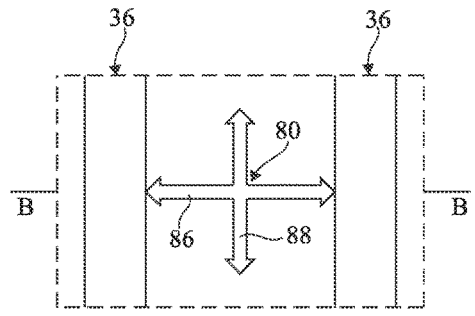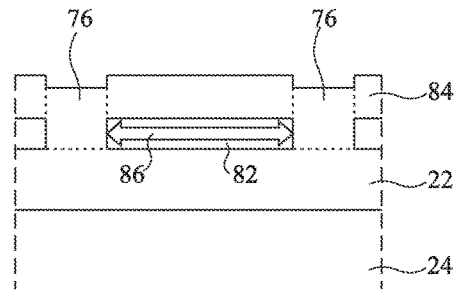
Fig 12A    Fig 12B

METHOD OF FORMING STRAINED MOS TRANSISTORS

PRIORITY CLAIM

This application claims the priority benefit of French Application for Patent No. 1563507, filed on Dec. 31, 2015, the disclosure of which is hereby incorporated by reference in its entirety to the maximum extent allowable by law.

TECHNICAL FIELD

The present disclosure relates to the field of transistors, in particular to a MOS transistor formed inside and on top of a strained active area.

BACKGROUND

The performance of certain types of MOS transistors may be improved by the presence of strain in the channel region.

In particular, in a P-channel MOS transistor having a SiGe silicon-germanium channel region, directed along crystal direction <100>, the mobility of holes is increased by compressive strain oriented along the drain-source direction, that is, the direction of the transistor length. However, compressive strain in the direction of the transistor width decreases the mobility of holes. It is desirable to increase the mobility to increase the transistor speed.

Known methods to form strained transistors raise various problems, particularly in the case of transistors having very small dimensions, formed inside and on top of active areas having a length shorter than 400 nm.

SUMMARY

An embodiment provides a method of forming a transistor, comprising the steps of: a) forming a semiconductor layer extending on an insulating layer; b) thermally oxidizing the semiconductor layer across its entire thickness to form two bars extending in the transistor gate width direction; and c) forming insulating trenches directed along the transistor gate length direction, the semiconductor layer being strained before or after step a).

An embodiment provides a method of forming a transistor comprising the steps of: a') forming a strained semiconductor layer extending on an insulating layer; b') thermally oxidizing the strained layer across its entire thickness to form two bars extending in the transistor gate width direction; and c') forming insulating trenches directed along the transistor gate length direction.

According to an embodiment, step b') occurs after step a').

According to an embodiment, step a') occurs after step b').

According to an embodiment, the strained layer is made of silicon-germanium, the strain being compressive strain.

According to an embodiment, the strained layer has a thickness in the range from 5 to 8 nm.

According to an embodiment, step a') is carried out at a temperature in the range from 850 to 1,000° C. for a time period in the range from 5 to 15 min.

According to an embodiment, the strained layer is made of silicon, the strain being extension strain.

An embodiment provides a transistor formed inside and on top of an active area of a semiconductor layer, the active area being delimited, lengthwise, by thermal oxide bars imposing in the active area strain along the transistor gate length direction and, along the transistor gate width direction, by insulating trenches leaving the active area free of strain widthwise.

According to an embodiment, the strained semiconductor layer is made of silicon-germanium and rests on a silicon oxide insulating layer, the oxide bars being made of silicon oxide and of germanium, the strain being compressive strain.

According to an embodiment, the strained semiconductor layer is made of silicon, the oxide bas being made of silicon oxide, the strain being extension strain.

BRIEF DESCRIPTION OF THE DRAWINGS

The foregoing and other features and advantages will be discussed in detail in the following non-limiting description of specific embodiments in connection with the accompanying drawings, wherein:

FIGS. 3A to 8A and 3B to 8B illustrate an example of a MOS transistor manufacturing method;

FIGS. 9A to 12A and 9B to 12B illustrate another example of a MOS transistor manufacturing method;

DETAILED DESCRIPTION

Figure 1:
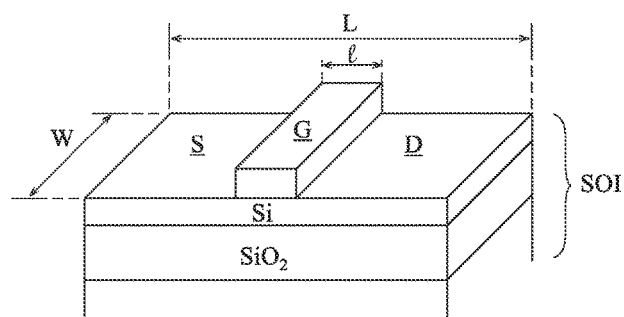
FIG. 1 is a perspective view of a MOS transistor formed inside and on top of an active area.

The same elements have been designated with the same reference numerals in the different drawings and, further, the various drawings are not to scale. For clarity, only those steps and elements which are useful to the understanding of the described embodiments have been shown and are detailed. In particular, gate structure details such as gate insulators and insulating spacers are not shown.

In the following description, when reference is made to terms qualifying position, such as terms "bottom", "upper", etc., or terms qualifying direction such as terms "horizontal", "vertical", etc., reference is made to the orientation of the concerned element in FIGS. 1, 2A to 2C and 3B to 8B. Unless otherwise specified, expression "in the order of" means to within 10%, preferably to within 5%.

FIG. 1 is a perspective view of a MOS transistor formed inside and on top of a rectangular active area. The active area formed in a layer of semiconductor (Si) on insulator ($SiO_2$) is laterally delimited by insulators, not shown. The transistor comprises a gate structure G separating a drain area D from a source area S. The gate has a length l between the drain and source areas and a width W in the orthogonal direction. The transistor dimension in the gate length direction will here be called length L and its dimension in the gate width direction will be called width W of the transistor.

Figure 2A:
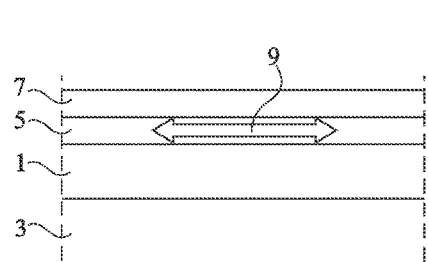
FIGS. 2A to 2C illustrate an embodiment of a MOS transistor.
Figure 2B:
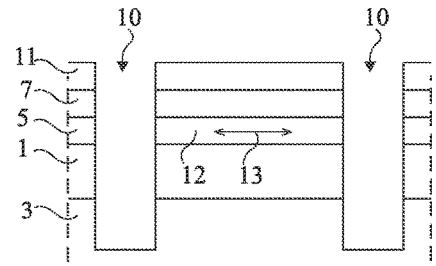
Figure 2C:
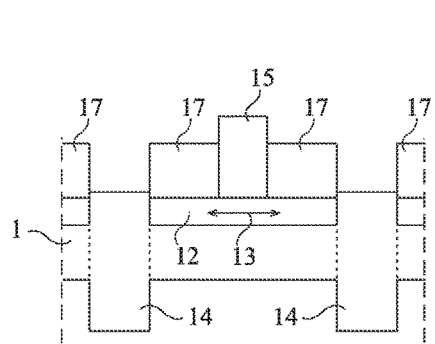

FIGS. 2A to 2C illustrate an embodiment of a P-channel MOS transistor.

FIG. 2A is a cross-section view of a wafer portion at an initial manufacturing step. A silicon oxide insulating layer 1 is arranged on a support 3. A strained semiconductor layer 5, for example, made of SiGe, extends on insulating layer 1 and is covered with a silicon oxide layer 7. Layers 5 and 7 for example have been formed from the thin upper silicon layer of a structure of silicon-on-insulator type, SOI. To form layers 5 and 7, a SiGe epitaxy is first carried out on the thin silicon layer. During the epitaxy, a lattice mismatch causes biaxial horizontal compressive strain 9 in the epitaxial layer. Then, the upper surface of the assembly is thermally oxidized. The silicon preferably oxidizes and the germanium migrates downwards, while strain 9 intensifies. SiGe layer 5 is then obtained on insulating layer 1 and under silicon oxide layer 7.

As an example, SiGe layer 5 has a thickness in the range from 5 to 8 nm. Silicon oxide layer 7 may have a thickness in the range from 3 to 6 nm. The proportion of germanium in layer 5 may be in the range from 10 to 40%.

At the step illustrated in FIG. 2B, insulating trenches 10 have been etched by using masking layers 11. Trenches 10 thoroughly cross SiGe layer 5 and surround active areas 12. Insulating trenches 10 may thoroughly cross insulating layer 1. For clarity, only two trenches 10 and one active area 12 are shown, the distance between trenches corresponding in the view of FIG. 2B to the length L of the transistor to be formed. The digging of the trenches has disengaged the edges of active area 12. Thereby, only a residual portion 13 of the initial strain 9 remains in a central portion of active area 12.

At the step illustrated in FIG. 2C, a P-channel MOS transistor has been obtained. Insulating trenches 10 have been filled with an insulator 14, for example, silicon oxide. A gate structure 15 has been formed on a central portion of active area 12. Drain and source areas 17, for example, made of boron-doped silicon-germanium, have been formed by epitaxy on either side of gate structure 15.

Figure 2D:
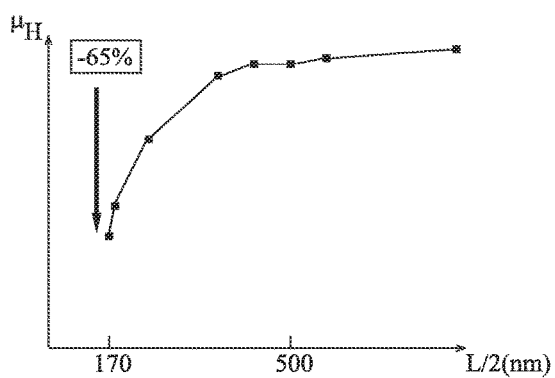
FIG. 2D illustrates the mobility of holes in P-channel MOS transistors obtained by the method illustrated in FIGS. 2A to 2C.

FIG. 2D illustrates the mobility of holes $\mu_H$ in arbitrary units in transistors obtained by the method of FIGS. 2A to 2C, according to length L of the transistors. The lengthwise strain has been released on digging of the insulating trenches, the width for example being 170 nm. Residual lengthwise strain 13 is all the smaller as the transistor length is short. In a transistor shorter than 180 nm, the mobility of holes is smaller by 65% than the mobility of holes in a transistor longer than 500 nm.

It is thus desired to have a method enabling to form a transistor from a strained semiconductor layer without releasing the lengthwise strain in this layer.

FIGS. 3A to 8A are top views illustrating successive steps of an example of a MOS transistor manufacturing method. FIGS. 3B to 6B are cross-section views along a plane BB orthogonal to the width direction, respectively corresponding to FIGS. 3A to 6A. FIG. 7B is a cross-section view along plane CC of FIG. 7A and FIG. 8B is a perspective and cross-section view corresponding to FIG. 8A.

In FIGS. 3A and 3B, a strained semiconductor layer 20, for example, made of SiGe, extends on an insulator 22 covering a support 24. Layer 20 has been obtained, for example from a SOI-type structure by a method similar to that described in relation with FIG. 2A that is, comprising a SiGe epitaxy followed by a thermal oxidation. A silicon oxide layer 25 covers SiGe layer 20. Strain 26 in layer 20 is horizontal and biaxial. The strain has a lengthwise component 28 and a widthwise component 30.

In FIGS. 4A and 4B, a masking layer 32, for example, made of silicon nitride, is deposited over the upper surface of the assembly. Openings 34 are etched in the masking layer and in silicon oxide layer 25 all the way to the upper surface of strained SiGe layer 20. The etched areas form, in top view, bands 36 parallel in the width direction. At this step, strain 26 in layer 20 is not modified.

In FIGS. 5A and 5B, a thermal oxidation is carried out in layer 20 from openings 34. The portions of layer 20 located at the bottom of openings 34 are oxidized across their entire thickness. The formed oxide forms parallel insulating bars 38, in contact with insulating layer 22. The vertical dimension or height of the bars is greater than the total thickness of strained layer 20 and of silicon oxide layer 25. A portion 40 of layer 20 is thus insulated on both sides between oxide bars 38.

It should be noted that the oxidation step does not release strain 26 in layer portion 40. Component 28 of the strain is thus maintained by thermal oxide bars 38 along the entire length of portion 40 without being attenuated. Further, the volume increase of the oxidized portions of layer 20 may even add an additional compression to component 28.

The thermal oxidation of SiGe may be carried out in a furnace at a temperature lower than 1,000° C. for a time period in the range from a few minutes, for example, 3 minutes, to a few tens of minutes, for example, 100 minutes. This oxidation may also be performed by rapid thermal oxidation at a temperature in the range from 950 to 1,200° C. for a time period in the range from a few tens of seconds, for example, 30 seconds, to a few hundreds of seconds, for example, 1,000 seconds.

In FIGS. 6A and 6B, masking layer 32 and oxide layer 25 have been removed by etching. The height of bars 38 has been decreased by the etching of the silicon oxide layer, but remains greater than the thickness of the SiGe layer portion 20. Strain 26 is thus maintained in portions 40 of layer 20 by oxide bars 38 which are used as stops.

Figure 7A:
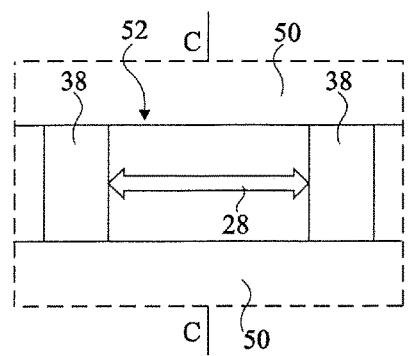
Figure 7B:
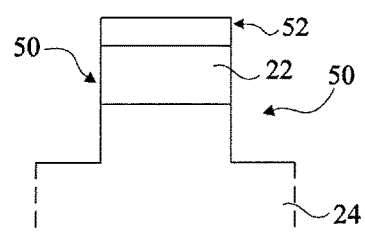

FIGS. 7A and 7B illustrate the structure at a subsequent manufacturing step. FIG. 7B is a cross-section view along plane CC of FIG. 7A and not, as previously, along plane BB. Two trenches 50 have been dug in the direction of the device length. Thus, the assembly of trenches 50 and of thermal silicon oxide regions 38 delimits an active SiGe area 52. Trenches 50 may extend in substrate 24, conversely to openings 34 which stop at the surface of strained SiGe layer 20. Conversely to openings 34 which preserve strain 28 in layer 20 in the direction of the device length, trenches 50 practically totally remove strain 30 in the gate width direction, as described hereabove in relation with FIGS. 2A to 2D. Such a strain removal is all the more significant as active area 52 is narrow, which is the current case, the active areas for example having a length shorter than 300 nm and a width shorter than 200 nm.

Figure 8A:
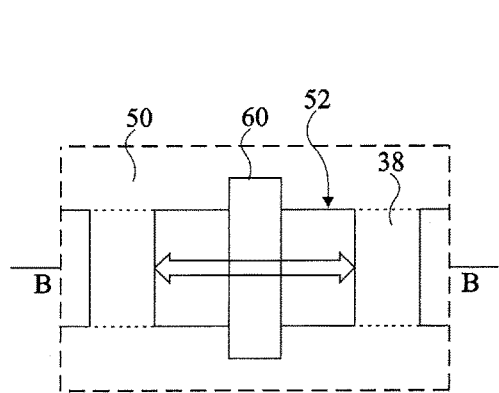
Figure 8B:
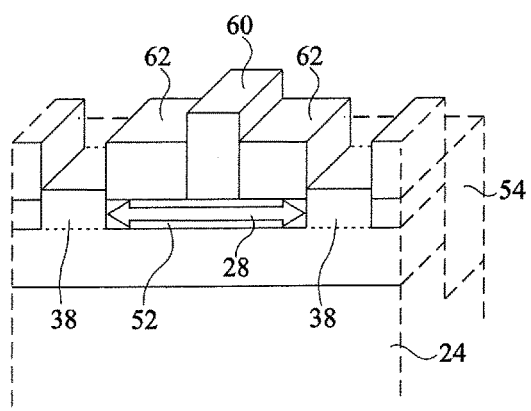

FIG. 8A shows a subsequent step of the manufacturing method and FIG. 8B is a cross-section view along plane BB and in perspective. As illustrated in FIG. 8B, trenches 50 have been filled with an insulator 54, after which a gate 60 and epitaxial drain and source overthicknesses 62 have been formed.

A transistor occupying the surface of active area 52, with released widthwise strain and with strain 28 maintained lengthwise, is thus obtained. As previously indicated, the holding of the lengthwise strain and its suppression widthwise cause the forming of a particularly fast transistor.

FIGS. 9A to 12A are top views illustrating successive steps of another example of a MOS transistor manufacturing method. FIGS. 9B to 12B are cross-section views along a plane BB orthogonal to the gate width direction, respectively corresponding to FIGS. 9A to 12A.

In FIGS. 9A and 9B, a masking layer 72, for example, made of silicon nitride, is deposited over the upper surface of upper silicon layer 70 of an SOI structure. The SOI structure comprises, under upper layer 70, an insulator 22 covering a support 24. Openings 74 are etched in masking layer 72 all the way to the upper surface of layer 70. Openings 74 form, in top view, bands 36 in the width direction.

In FIGS. 10A and 10B, semiconductor layer 70 is thermally oxidized from openings 74. The oxidized portions of layer 70 form insulating bars 76 in contact with insulating layer 24. As a variation, to form insulating bars 76, layer 70 may be etched across its entire thickness from openings 74, after which the etched portions and openings 74 may be filled with oxide.

In FIGS. 11A and 11B, masking layer 72 is first removed by etching. A SiGe layer 78 is then epitaxially grown on the upper surface of the non-oxidized portions of semiconductor layer 70. During the epitaxy, a lattice mismatch causes compressive strain in layer 78, as described in relation with FIG. 2A. The obtained layer 78 is strained 80 both widthwise and lengthwise.

In FIGS. 12A and 12B, a thermal oxidation is performed. As previously described, germanium migrates downwards to form strained SiGe layer portions 82 arranged between bars 76. During the oxidation, a silicon oxide layer 84 forms on layer 82.

After removal by etching of oxide layer 84, an assembly corresponding to the step illustrated in FIGS. 6A and 6B, where portions 40 of strained layer between bars 38 are replaced with equivalent layer portions 82, is obtained. Similarly to portions 40 of FIGS. 6A and 6B, layer portions 82 are strained 88 widthwise and are strained 86 lengthwise between bars 76 which are used as stops.

A transistor is then formed after steps equivalent to the steps illustrated in top view in FIGS. 7A and 8A, the strain in the gate width direction being released by the forming of trenches in a direction orthogonal to that of strips 36.

In the above-described methods, strained layers are obtained for enabling a particularly fast transistor to be formed. Other methods such as methods recited in patent application US 2007/0262392 or patent application US 2008/0251842 were proposed previously for obtaining a strained portion of a silicon layer by thermally oxidizing two bars at both sides of the layer.

Figure 13A:
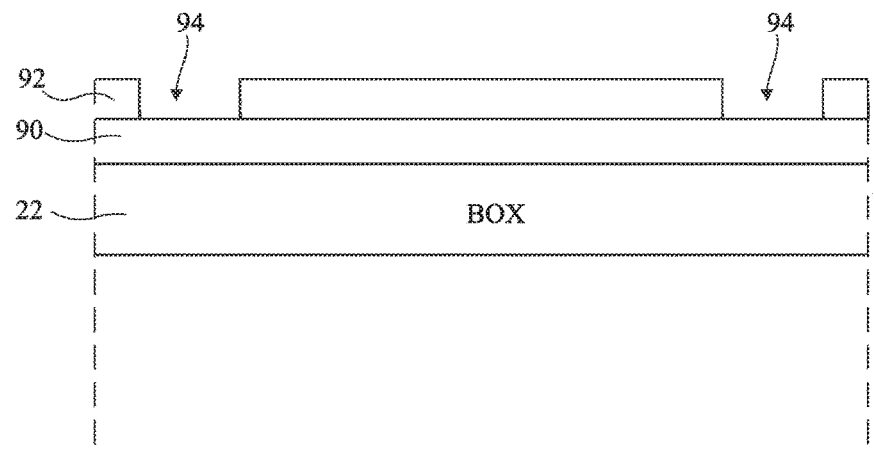
FIGS. 13A and 13B are cross-section views illustrating a method for obtaining a strained layer.
Figure 13B:
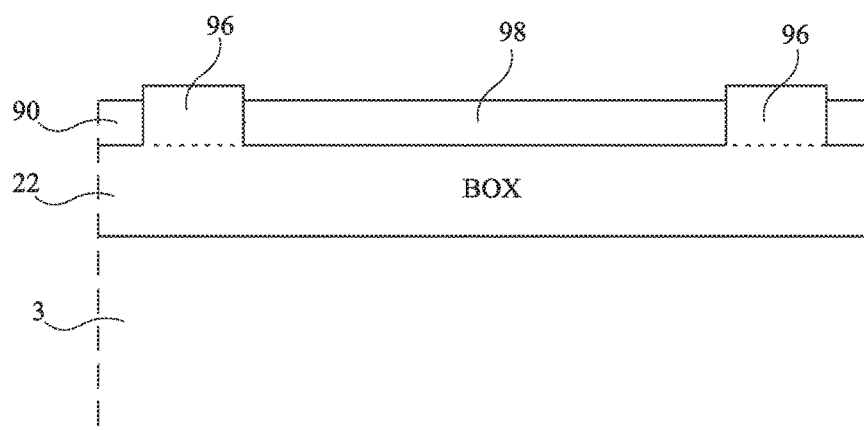

FIGS. 13A and 13B are cross-section views illustrating such a method for obtaining a strained silicon layer portion.

In FIG. 13A, an SOI structure is provided, made of a silicon upper layer 90 positioned on an insulator (BOX) 22 covering a support 3. A mask 92 is deposited over the SOI structure, and openings 94 are then etched in the mask down to the upper surface of silicon layer 90.

In FIG. 13B, a thermal oxidation is carried out in layer 90 through openings 94, down to the upper surface of the insulator 22, and next the mask is removed. Thus, oxide bars 96 are formed in contact with insulator 22. A lengthwise compressive strain (not shown) is obtained in a portion 98 of the layer 90 between the bars 96.

Figure 14:
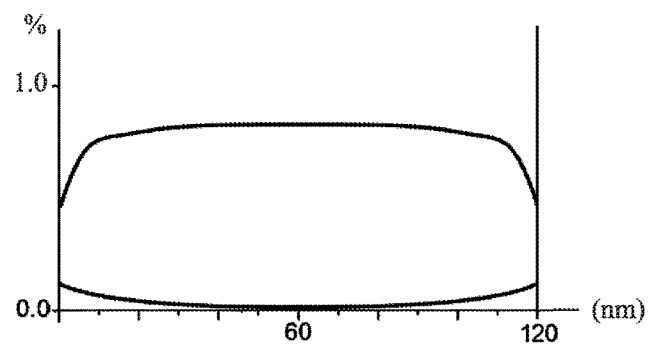
FIG. 14 illustrates compressive strains in strained layer portions.

FIG. 14 shows curves illustrating lengthwise compressive strains 86 and 100 in strained layer portions, each of 120 nm in length between two bars, as a function of the distance from one of the bars. The curve 100 illustrates the strain in the silicon layer portion 98 obtained by the method of FIGS. 13A and 13B. The curve 86 illustrates the strain in the SiGe layer portion 82 of an assembly corresponding to the step of FIG. 6A obtained by implementing the steps of FIGS. 9A to 12B.

The center region of each strained layer portion corresponds to a channel region of a transistor, and the higher the lengthwise compressive strain level of this channel region, the faster the transistor. On one hand, in curve 86, the lengthwise compressive strain near the center of the strained SiGe layer is more than 0.8%, enabling a particularly fast transistor to be formed. On the other hand, the lengthwise compressive strain of curve 100 nearly vanishes near the center of the silicon layer. Therefore, transistors having channel regions obtained by manufacturing methods such as the methods of FIGS. 3A to 8C or FIGS. 9A to 12B are faster than similar transistors having channel regions obtained by the method of FIGS. 13A and 13B or the like.

Specific embodiments have been described. Various alterations, modifications, and improvements will occur to those skilled in the art. In particular, although, in the above-described example of a method, the insulating trench forming step described in relation with FIGS. 7A and 7B occurs after the steps described in relation with FIGS. 3A to 6A of forming of thermal oxide bars, the insulating trenches may be formed and filled before the forming of the thermal oxide bars.

Further, although the above-described examples of methods concern the forming of a P-channel MOS transistor from a compressively strained SiGe layer, a similar method may be used to form active semiconductor areas with a lengthwise strain and no widthwise strain, or conversely. In particular, an N-channel MOS transistor may be formed from a silicon layer with an extension strain.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method, comprising:
    a) providing a base semiconductor layer on an insulating layer;
    b) at opposite ends of a transistor length, thermally oxidizing the base semiconductor layer across an entire thickness of the base semiconductor layer to form two insulating bars extending in a direction of a transistor width;
    c) epitaxially growing an epitaxial semiconductor layer on said base semiconductor layer, said epitaxial semiconductor layer growth inducing a strain having a first component extending in a direction of the transistor length and a second component extending in the direction of the transistor width;
    d) thermally oxidizing the epitaxial semiconductor layer to produce from said base semiconductor layer on the insulating layer a strained semiconductor layer exhibiting said strain; and
    e) forming insulating trenches in the strained semiconductor layer extending in the direction of the transistor length, said insulating trenches releasing the second component of said strain.

2. The method of claim 1, wherein the strained semiconductor layer is made of silicon-germanium, the strain being compressive strain.

3. The method of claim 2, wherein the entire thickness of the strained semiconductor layer is in a range from 5 to 8 nm.

4. The method of claim 1, wherein the epitaxial semiconductor layer is made of silicon-germanium, and the base semiconductor layer is made of silicon.

5. The method of claim 1, wherein the two insulating bars and the insulating trenches delimit an active area for a transistor, the method further comprising:

defining source, drain and channel regions within the active area; and forming an insulated gate over the channel region.

6. The method of claim 1, wherein step b) comprises:

masking off an active area to define mask openings at the opposite ends of the transistor length; and performing a thermal oxidization of the base semiconductor layer which is exposed by the mask openings.

7. A method, comprising:
a) forming a semiconductor layer on an insulating layer made of a first semiconductor material;
b) at opposite ends of a transistor length, thermally oxidizing the semiconductor layer across an entire thickness of the semiconductor layer to form two insulating bars extending in the direction of a transistor width;
c) epitaxially growing an epitaxial semiconductor layer on said semiconductor layer, wherein the epitaxial semiconductor layer is made of a second semiconductor material different from the first semiconductor material and having a lattice mismatch with respect to the first semiconductor material which induces a strain;
d) thermally oxidizing the epitaxial semiconductor layer to transfer said strain to the semiconductor layer and convert the epitaxial semiconductor layer to an oxide layer; and
e) forming insulating trenches extending in the direction of the transistor length on opposed sides of the transistor width, said insulating trenches releasing a component of the transferred strain.

8. The method of claim 7, wherein the epitaxial semiconductor layer is made of silicon-germanium and the semiconductor layer is made of silicon.

9. The method of claim 7, wherein the two insulating bars and the insulating trenches delimit an active area for a transistor, the method further comprising:

defining source, drain and channel regions within the active area; and forming an insulated gate over the channel region.

10. The method of claim 7, wherein step b) comprises:

masking off an active area to define mask openings at the opposite ends of the transistor length; and performing a thermal oxidization of the semiconductor layer which is exposed by the mask openings.

* * * * *